US005953244A

United States Patent [19]

Okada et al.

[11] Patent Number: 5,953,244

[45] Date of Patent: Sep. 14, 1999

[54] SEMICONDUCTOR MEMORY DEVICE CAPABLE OF PAGE MODE OR SERIAL ACCESS MODE

[75] Inventors: Mikiro Okada; Koji Komatsu, both of Nara, Japan

[73] Assignee: Sharp Kabushiki Kaisha, Osaka, Japan

[21] Appl. No.: 08/976,296

[22] Filed: Nov. 21, 1997

[30] Foreign Application Priority Data

Feb. 12, 1997 [JP] Japan .................................... 9-028148
Feb. 14, 1997 [JP] Japan .................................... 9-029945

[51] Int. Cl.[6] ........................................ G11C 5/06

[52] U.S. Cl. ........................................ 365/63; 365/230.06

[58] Field of Search ................................. 365/63, 230.06

[56] References Cited

U.S. PATENT DOCUMENTS

| | | | |
|---|---|---|---|
| 5,706,243 | 1/1998 | Mori | 365/230.06 |
| 5,708,620 | 1/1998 | Jeong | 365/230.06 |
| 5,708,621 | 1/1998 | Tanoi | 365/230.06 |
| 5,774,653 | 6/1998 | Katevenis | 395/200.3 |

FOREIGN PATENT DOCUMENTS 7-98989 4/1995 Japan .

*Primary Examiner*—David Nelms
*Assistant Examiner*—M. Tran
*Attorney, Agent, or Firm*—Morrison & Foerster LLP

[57] ABSTRACT

A semiconductor memory is arranged so that a first memory cell array is provided on one side of a set of a row decoder and word line driving circuits, while a second memory cell array is provided on an opposite side thereof. In the semiconductor memory thus arranged, the first memory cell array has less memory cells so that the first memory cell array has shorter word lines, so that more speedy access to a top data is achieved. By doing so, the access to the top address is made speedy in the high access mode such as the page mode or the serial access mode, with no increase in chip areas in the semiconductor memory and no increase in power consumption. Furthermore, in a semiconductor memory which stores first data requiring a comparatively higher read-out speed (for example, program data) and second data requiring a read-out speed lower than that of the first data, the first data is stored in the memory cell array having the shorter word lines, while the second data is stored in the memory cell array having the longer word lines. By doing so, read-out speeds in accordance with the types of stored data can be obtained, without wasteful power consumption in the word line driving circuits.

8 Claims, 15 Drawing Sheets

RANDOM ACCESS
FIRST WORD
0
20
40
60
80
100%
INPUT BUFFER ①
DECODER ②
③ DRIVE OF WORD LINE
DRIVE OF BIT LINES INVERT OF SENSE AMPLIFIERS ④
SELECTOR OUTPUT BUFFER ⑤
SECOND WORD
INPUT BUFFER ①
DECODER ②
DRIVE OF WORD LINE ③
DRIVE OF BIT LINES INVERT OF SENSE AMPLIFIERS ④
SELECTOR OUTPUT BUFFER ⑤
140%
PAGE ACCESS

RANDOM ACCESS
FIRST WORD
SECOND WORD
PAGE ACCESS
0
20
40
60
80
100%
175%
INPUT BUFFER ①
DECODER ②
③ DRIVE OF WORD LINE
DRIVE OF BIT LINES INVERT OF SENSE AMPLIFIERS ④
SELECTOR OUTPUT BUFFER ⑤
DRIVE OF WORD LINE ③

SEMICONDUCTOR MEMORY DEVICE CAPABLE OF PAGE MODE OR SERIAL ACCESS MODE

FIELD OF THE INVENTION

The present invention relates to a semiconductor memory device having a high-speed access mode such as a serial access mode or a page mode, or relates to a semiconductor memory device for storing data of not less than two types which differ in read-out speeds that the data require.

BACKGROUND OF THE INVENTION

Recently, semiconductor memory devices (hereinafter referred to as semiconductor memories) having high-speed access modes such as a page mode or a serial access mode suitable for reading continuous data have been developed so as to meet a demand for faster access to data stored in the semiconductor memories. For example, in an read operation in the serial access mode, a plurality of memory cells in the same row (word line) of a memory cell array are simultaneously selected in accordance with an input address. Then, by changing a predetermined bit in the input address, data in the selected plural memory cells are switched at a high speed so as to be sequentially outputted.

A semiconductor memory disclosed by the Japanese Publication for Laid-Open Patent Application No. 7-98989/1995 (Tokukaihei 7-98989) is arranged as follows: a memory cell array is provided on each side of a row decoder for selecting word lines to be driven, and the memory cell arrays are symmetrically arranged on the sides of the row decoder so as to equalize access time.

The semiconductor memory has memory cell arrays A and B in which memory cells are disposed in a matrix form, as illustrated in FIG. 10. The semiconductor memory further includes row decoders 51 and 52, word line driving circuits 53*a* and 53*b*, a column decoder 54, and two bit line selecting circuits 55. The row decoder 51 selects rows corresponding to a row address (A13 through A19), while the row decoder 52 selects rows corresponding to a row address (A8 through A12). The word line driving circuits 53*a* and 53*b* drive word lines in accordance with outputs of the row decoders 51 and 52. The column decoder 54 and the bit line selecting circuits 55 select memory cells in a plurality of columns which correspond to a column address (A4 through A7). The semiconductor memory has a capacity of 8M bits ($2^{23}$ bits), and an output is set to 8 bits.

Note that 8 bits (D0 through D7) constitute one word, and 16 words (W0 through W15) constitute one page. And, in one word line, data of 16 pages (P0 through P15), that is, data of $2^3 \times 2^4 \times 2^4 = 2^{11}$ bits, are stored. The data are divided into two so as to be respectively stored in the memory cell array A and the memory cell array B. For example, data of W0 through W7, that is, $2^{10}$ bits, are stored in the memory cell array A, while data of W8 through W15, that is, $2^{10}$ bits, are stored in the memory cell array B.

The bit line selecting circuits 55 are respectively connected to sense amplifier circuits 56 each of which is composed of a plurality of sense amplifiers for detecting information of the respective memory cells, and the sense amplifier circuits 56 are connected to a selector circuit 57 for selecting outputs of the sense amplifier circuits 56 in accordance with a page signal (P0 through P15) based on a page address (A0 through A3). The selector circuit 57 is connected to an output buffer (not shown) so that the output of the selector circuit 57 is sent to an output terminal.

In the memory cell array A, the first through eighth words (W0 through W7) are stored, as described above. Therefore, in each of the word lines (WLiA) of the memory cell array A, the word data W0 through W7 are stored in this order, as illustrated in FIG. 11. Moreover, in each word data, first through 16th page data (P0 through P15) are provided in this order, and in each page data, the first through eighth data (D0 through D7) are provided in this order. Likewise, in the memory cell array B, ninth through 16th word data (W8 through W15) are stored.

The following description will explain a data read operation of the semiconductor memory, while referring to a timing chart in FIG. 12.

At a time t0, an address signal (A0 through A19) to be inputted to input buffers is determined, and a page address (a) is read out. This operation is the same as that in the random access mode.

First, when a row address (A8 through A19) is determined at a time t1, one of pairs of the word lines WLiA and WLiB is made active at a time t2 by the row decoders and the word line driving circuits. Namely, the word lines become "high"-level.

Then, with the determination of the column address (A4 through A7), one (CSj) of column selecting lines CS0 through CS15 becomes active ("high"-level), and a column selecting MOS transistor whose input terminal is connected to the column selecting line CSj becomes in an "ON" state. Subsequently, 128(=8×16) memory cells Mmijn (m=0 to 7, n=0 to 15) are selected in accordance with the above address so that pieces of information in the respective memory cells are supplied through the column selecting MOS transistor to the sense amplifier circuit 56. At a time t3, sense amplifier outputs (D0P0 through D7P15) are determined, and the read of the page data of the address designated by a column address and a row address (A4 through A19) finishes. Then, in accordance with a page address (A0 through A3), one of the output signals (P0 through P15) of a page mode decoder becomes active ("high"-level). By doing so, one of the sense amplifier outputs (DmPn) is selected by a selector circuit 57, and is sent to the output terminal (Dm) through the output buffer at a time t4. Thereafter, at a time t5, the page address (A0 through A3) starts changing, data of the sense amplifier outputs are sequentially selected by the selector circuit 57, and are sent to the output terminal through the output buffer at a time t6. Thus, within a time (t6−t4) since the start of the change of the page address (A0 through A3), the mode shifts to the page mode in which data are read at a high speed. Then, when the page address changes from "a" to "a+1", the operation is again carried out in the random access mode, and thereafter, the same step as described above is taken.

Thus, in the case where the column address and the row address A4 through A19 (hereinafter referred to as between-page address) change, data of the output terminal are not determined until outputs of a main data line, the sense amplifier outputs, and the output of the selector are determined, whereas in the case where the page address A0 through A3 (hereinafter referred to as in-page address) change, only a time required for the switching at the selector. Therefore, in the latter case, a page mode which enables high-speed reading is achieved since response to the changes of the in-page address is quick.

The following description will explain details of respective times required for major operations in the semiconductor memory, while referring to FIG. 13. Here, a time since the input of the input address to the semiconductor memory till the determination of the output data is given as 100 percent. A time since the input of the input address through the input buffer till the determination of the input to the decoders (the row decoders, the column decoder, and the page mode decoder) accounts for 10 percent (① in FIG. 13), an operating time of the decoders accounts for 10 percent (② in FIG. 13), a time for driving the word lines accounts for 30 percent (③ in FIG. 13), a time for drive of the bit lines and invert of the sense amplifiers due to operations of selected memory cells accounts for 30 percent (④ in FIG. 13), and operating times of the selector and the output buffer account for 20 percent (⑤ in FIG. 13).

In the case of the random access, all the times of 100 percent are required as described above, whereas in the case of the page access, only the operating times of the input buffer and the page mode decoder with respect to the page address and the operating time of the selector and the output buffer (①+②+⑤), which account for 40 percent in total, are required for the read operation.

Therefore, as illustrated in FIG. 14, in the read of data from the memory cell array A, 100 percent is required only for the first word. As to the second through eighth words, 40 percent is required for each. Besides, in respect to the memory cell array B, 100 percent is required only for the ninth word which is the top word thereof. On top of this, since the operations of ① through ④ can be conducted while the data is being read out from the memory cell array A, the ninth word can be outputted immediately after the output of the eighth word.

Thus in the foregoing conventional arrangement, the access to the second and subsequent address in the same page is quickly carried out, but a comparatively long time is required in the access to the top address. Therefore, more speedy access to the top address is now demanded.

Here, the reason why the access time for the top address is long in the high-speed access mode such as the page mode or the serial access mode is that it takes long to drive a word line and bit lines, as illustrated in FIG. 13.

A delay in transition of a word line to or from the "high"-level is substantially in proportion to a product (R×C) of a wire resistivity and a wire capacity of the word line, and the wire resistivity and capacity per unit length depend on a manufacturing process. Therefore, to reduce the delay, the word line length should be decreased, or a driving capacity of the word line driving circuit should be increased. Conventionally, to make the access to the top address more speedy, the memory cell array is segmented so that the word line length is decreased, or the driving capacity of the word driving circuit is enhanced.

However, in the case where the memory cell array is segmented so that the word line length decreases, such segmentation causes the word lines to be cut into pieces, thereby requiring more decoders, and as a result, chip areas increase in the semiconductor memory. In the case where the driving capacity of the word line driving circuit is enhanced, there arises a problem of an increase in consumed currency and the like.

The use of the semiconductor memory may not be limited to the use in the high-speed access mode, but it may be used in the random access mode.

Herein, in the case where a ROM (read only memory) is taken as an example of the semiconductor memory, data stored therein are not only one type, but various types of data are stored. The data of various types include those which require a comparatively high read-out speed, and those which may be read out at a lower speed. For example, program data require a relatively high read-out speed, whereas character font data for printout do not require a high read-out speed. In other words, the read-out of program data have to be conducted at a high speed for more speedy processing, whereas the read-out of character font data do not have to be conducted at such a high read-out speed, in relation to a processing speed of a printing device.

However, in conventional cases, such differences in the required read-out speeds depending on the types of the stored data are not particularly taken into consideration, and for example, program data and character font data are stored in the same manner.

The semiconductor memory, as illustrated in FIG. 15, has a memory cell array 61, an address buffer 62, a row decoder 63, a word line driving circuit 64, a column decoder 65, a bit line selecting circuit 66, a sense amplifier circuit 67, and an output buffer 68. In the memory cell array 61, a plurality of memory cells are arrayed in a matrix form. The address buffer 62 holds an address signal supplied from outside and sends it to the row decoder 63 and the column decoder 65. The row decoder 63 decodes content of a predetermined portion of the address signal supplied from the address buffer 62, and outputs a word line selecting signal. The word line driving circuit 64 drives a selected word line in response to the output of the row decoder 63. The column decoder 65 decodes content of another predetermined portion of the address signal supplied from the address buffer 62, and outputs a bit line selecting signal. The bit line selecting circuit 66 connects the sense amplifier circuit 67 with bit lines which are connected with a plurality of predetermined memory cells among a plurality of memory cells connected with a selected word line, in accordance with the output of the column decoder 65. The output buffer 68 outputs the read data to outside, in response to the output of the sense amplifier circuit 67.

As illustrated in FIG. 15, in the conventional ROM, for example, a predetermined region A in the memory cell array is assigned for storing program data and the like, while another predetermined region B is assigned for storing character font data and the like.

However, in the above conventional cases, differences in the required read-out speeds depending on the types of the stored data are not particularly taken into consideration, and for example, program data and character font data are stored in the same manner. Therefore, it is necessary to set the driving capacity of the word line driving circuit in accordance with the read-out speed of data which require the fastest read-out speed. As a result, the capacity is excessive with respect to the other portions for data which require a slower read-out speed, thereby wasting electric power. In other words, though less driving currency is satisfactory, excessive driving currency is used, and hence electric power is wastefully consumed.

SUMMARY OF THE INVENTION

The object of the present invention is to provide a semiconductor memory device which is arranged so that (1) access to a top address is made more speedy in a high-speed access mode such as the page mode or the serial access mode without an increase in chip areas of the semiconductor memory or an increase in electric power consumption, and (2) in the random access mode as well, a read-out speed suitable f or a type of stored data is obtained without wasteful electric power consumption in a word line driving circuit.

To achieve the above object, a semiconductor memory device of the present invention is characterized in comprising a memory cell array composed of a plurality of memory cells provided in a matrix form, the memory cell array being divided into at least two regions, wherein (1) each memory cell array region has different word lines from those in the other region so that each region is driven by the word lines thereof, and (2) one of the memory cell array regions has word lines shorter than those in the other region.

With the above arrangement of the semiconductor memory device, it is possible to reduce a time required for driving the word lines in the memory cell array region having the shorter word lines. Therefore, in the case of serial access, the access conducted by the semiconductor memory device thus arranged is made speedy, by storing the top data in the memory cell array region which has the shorter word lines.

Besides, by storing data requiring a high read-out speed in the memory cell array region having the shorter word lines, the drive of the word lines is carried out at a high speed, and a high-speed read is realized. On the other hand, in the case where data which may be read at a comparatively lower read-out speed are stored in the region having the longer word lines, a read operation at a lower speed is applied to the data. Therefore, by appropriately setting the lengths of the word lines in the memory cell array regions, the semiconductor memory device is arranged so that no electric power is wastefully consumed in word line driving circuits, and data of various types are read out at appropriate read-out speeds in accordance with their required read-out speeds, respectively.

For a fuller understanding of the nature and advantages of the invention, reference should be made to the ensuing detailed description taken in conjunction with the accompanying drawings.

DESCRIPTION OF THE PREFERRED EMBODIMENTS

[First Embodiment]

The following description will explain an embodiment of the present invention.

Figure 1:
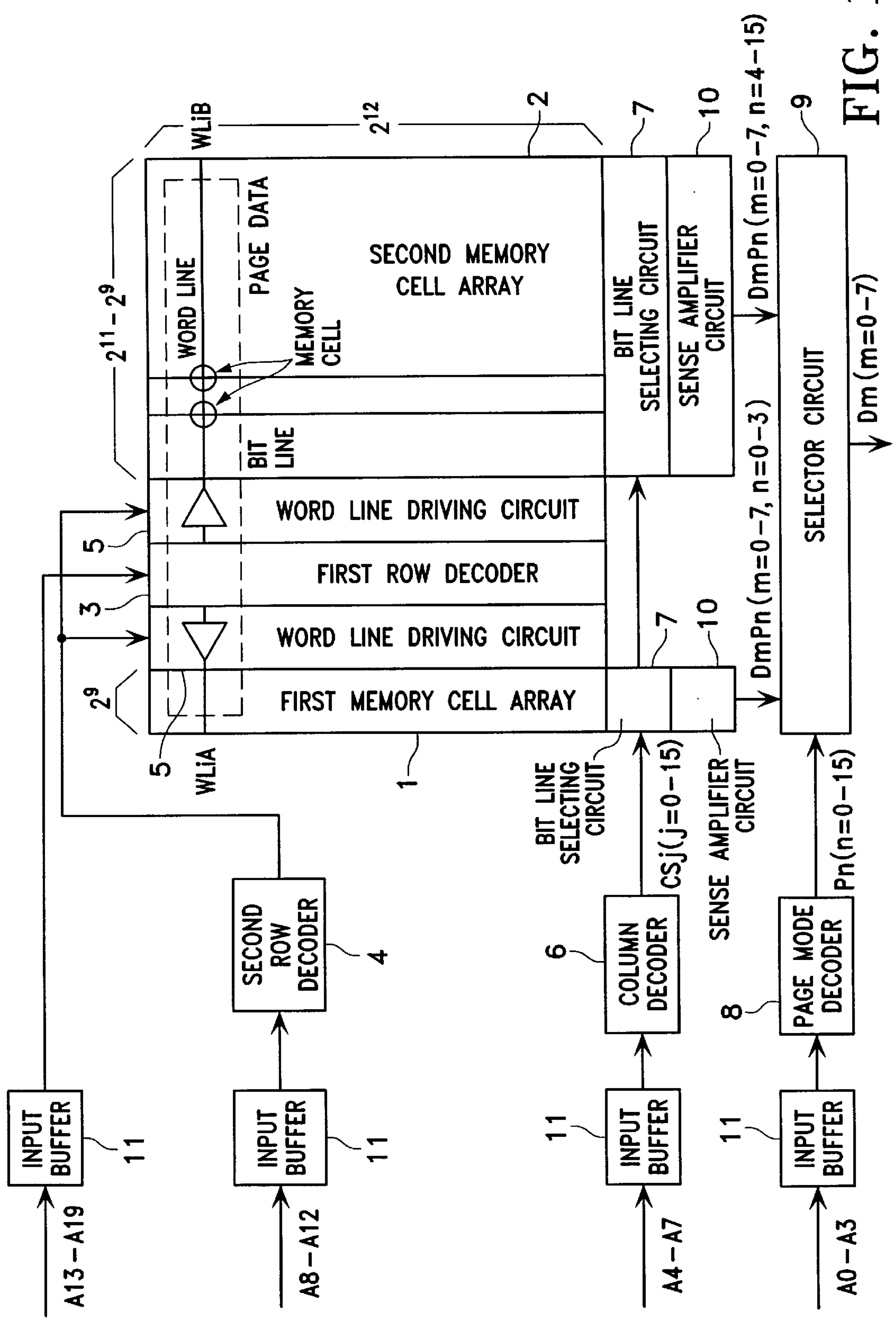
FIG. 1, showing an embodiment of the present invention, is a block diagram illustrating a schematic arrangement of primary parts of a semiconductor memory.

As illustrated in FIG. 1, a semiconductor memory device (hereinafter referred to as a semiconductor memory) of the present embodiment has a first memory cell array 1 and a second memory cell array 2, in which memory cells are provided in a matrix form. The semiconductor memory further includes a first row decoder 3, a second row decoder 4, and two word line driving circuits 5 as means for driving word lines WLiA and WLiB (i=0 to $2^{12}-1$) in a certain row. Besides, the semiconductor memory further includes a column decoder 6, and bit line selecting circuits 7 as means for driving a plurality of columns of bit lines, and a page mode decoder 8 for changing pages. Addresses are inputted to each decoder through each input buffer 11.

Note that word line selecting means described in claim 2 is composed of the row decoder 3 and the word line driving circuits 5. In addition, the first memory cell array 1 and the second memory cell array 2 constitute regions of a memory cell array described in claim 1, respectively.

The first memory cell array 1 and the second memory cell array 2 are provided so as to have the first row decoder 3 and the word line driving circuits 5 therebetween, and the number of the bit lines in the first memory cell array 1 is less than the number of the bit lines in the second memory cell array 2.

Furthermore, the first row decoder 3 selects a plurality of rows (word lines) corresponding to higher bits (A13 through A19) of a row address, while the second row decoder 4 selects a row corresponding to lower bits (A8 through A12) of the row address, among the plural rows selected by the row decoder 3. Thus, the word line driving circuits 5 drive the word lines thus selected by the row decoder 4. Therefore, a pair of word lines WLiA and WLiB corresponding to the inputted row address (A8 through A19) is driven by the row decoder 3, the row decoder 4, and the word line driving circuits 5. Note that one of the word line driving circuits 5 corresponds to the first memory cell array 1, while the other correspond to the second memory cell array 2.

The column decoder 6 and the bit line selecting circuits 7 are arranged so as to select one among column selecting lines CSj which correspond to the column address (A4 through A7), and when one of the column selecting lines CSj is selected, a plurality of bit lines corresponding to the selected column selecting lines CSj are driven by the column selecting MOS transistor. Note that the column selecting lines CSj and the column selecting MOS transistor are included in the bit line selecting circuits 7.

The bit line selecting circuits 7 are respectively connected to sense amplifier circuits 10 each of which is composed of a plurality sense amplifiers for detecting information from each memory cell. The sense amplifier circuits 10 are connected to a selector circuit 9. The selector circuit 9 selects outputs among those from the sense amplifier circuit 10, in accordance with a page signal (P0 through P15) based on a page address (A0 through A3). The selector circuit 9 is connected to an output buffer (not shown) so that an output of the selector circuit 9 is sent to an output terminal through the output buffer.

In respect to the present embodiment, a case where the first through fourth words (W0 through W3) among page data are stored in the first memory cell array 1 while the other fifth through 16th words (W4 through W15) are stored in the second memory cell array 2 is taken as an example. Herein, the following description will explain an arrangement of data to be stored in one word line, while referring to FIG. 2.

Figure 2:
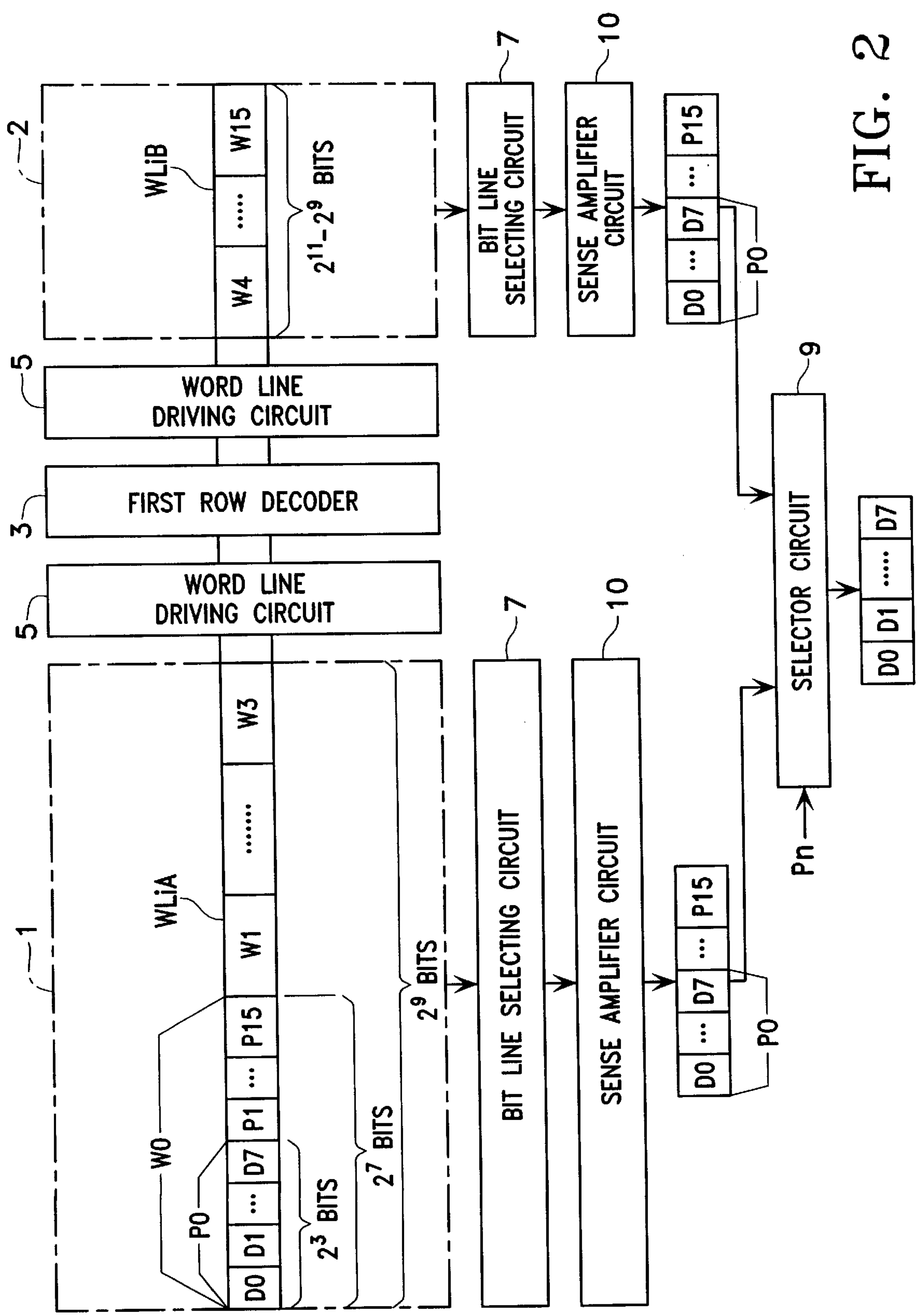
FIG. 2 is an explanatory view illustrating an example of an arrangement of data which are stored in the semiconductor memory.

To start with, in the first memory cell array 1, the first through fourth words (W0 through W3) are stored, as described above. Therefore, in a word line (WLiA) in the first memory cell array 1, word data W0 through W3 are stored in this order, as illustrated in FIG. 2. Besides, in each word data, data of the first through 16th pages (P0 through P15) are arrayed in this order, and in each page data, first through eighth data (D0 through D7) are arrayed in this order.

Note that the top word must be stored in the first memory cell array 1, but the subsequent words may be stored any one of the first and second memory cell arrays 1 and 2.

Data which are simultaneously read out from the memory cell array are data of one word, and the data are sent to the selector circuit 9 through the bit line selecting circuit 7 and the sense amplifier circuit 10. The selector circuit 9 receives, from the page mode decoder 8, a page signal Pn corresponding to the page address (A0 through A3), and outputs a data signal Dm (m=0 to 7) which corresponds to the page signal Pn.

In the semiconductor memory thus arranged, the first memory cell array 1 and the second memory cell array 2 have the same length in a column direction (bit line direction), while in a row direction (word line direction), they have lengths whose ratio is 4:12 so as to be in proportion to the ratio of the numbers of words stored therein. As compared with a conventional semiconductor memory wherein the length ratio in the row direction (word line direction) is 8:8, in the first memory cell array 1 in the present embodiment where the first through fourth words are stored, a product of a wire resistivity and a wire capacity of a word line (R×C) is ¼ ($=\frac{4}{8}\times\frac{4}{8}$) of that in the conventional case. In the second memory cell array 2 where the fifth and subsequent words are stored, the product is $\frac{9}{4}$ ($=\frac{12}{8}\times\frac{12}{8}$) of that of the conventional case.

Figure 3:
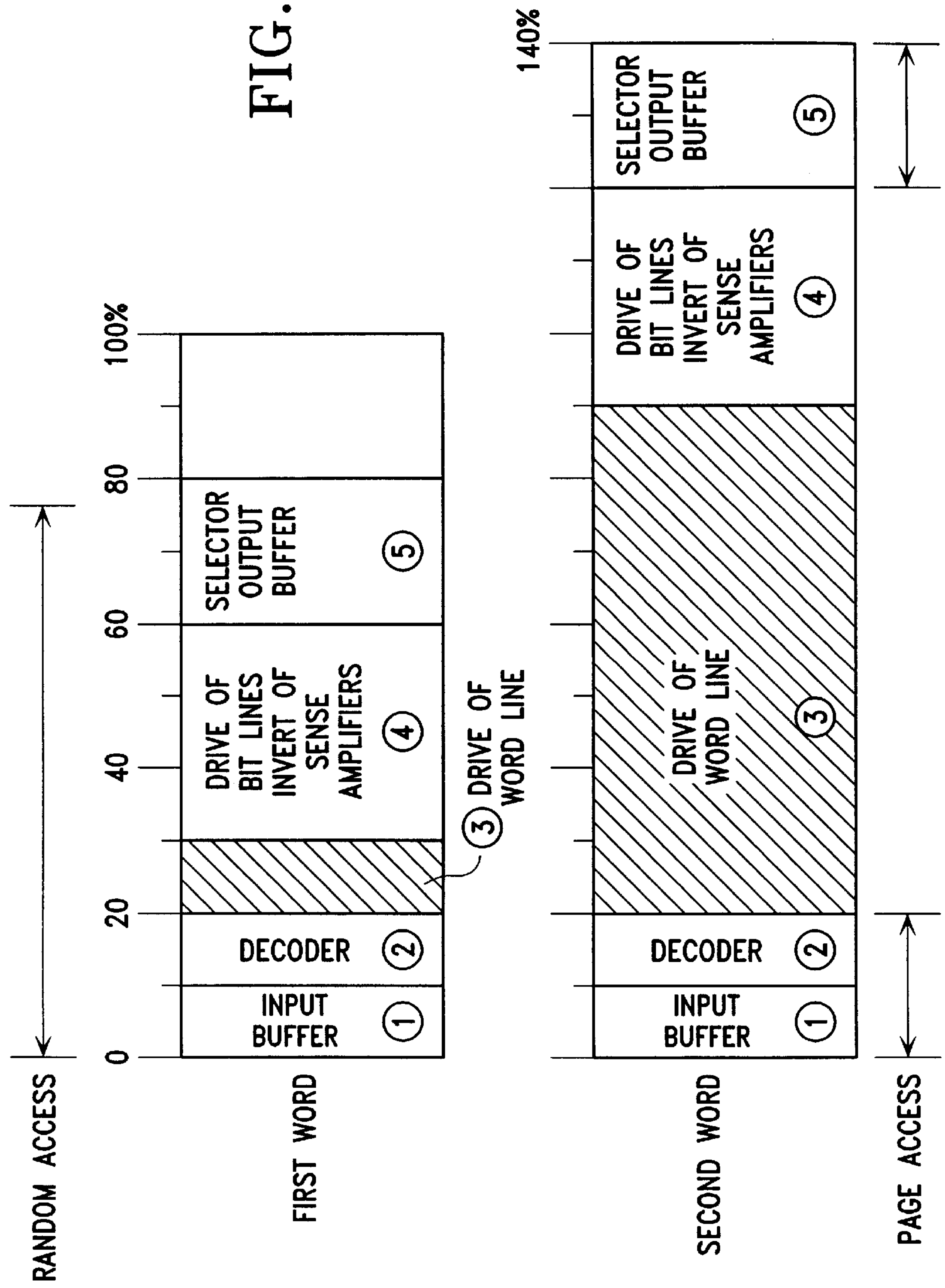
FIG. 3 is an explanatory view illustrating an example set of detailed times required for primary operations of the semiconductor memory.
Figure 13:
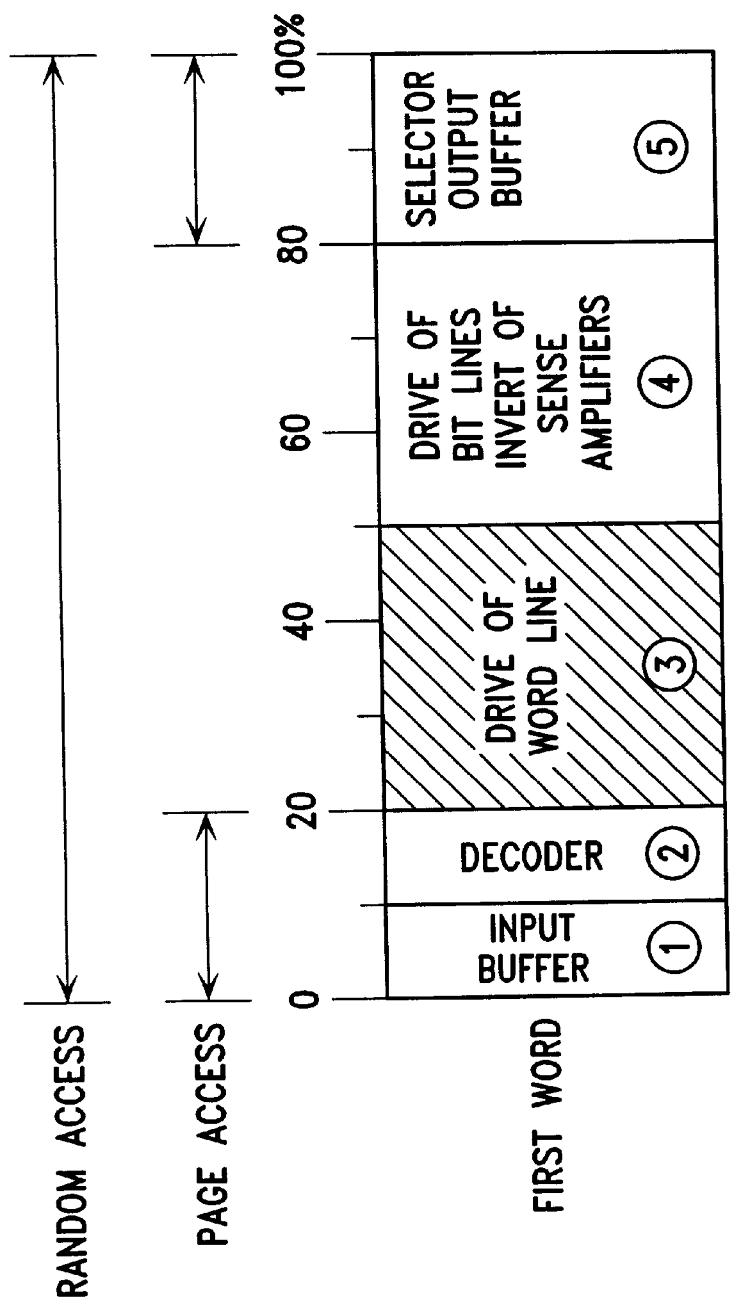
FIG. 13 is an explanatory view illustrating detailed times required for primary operations of the conventional semiconductor memory.
Figure 14:
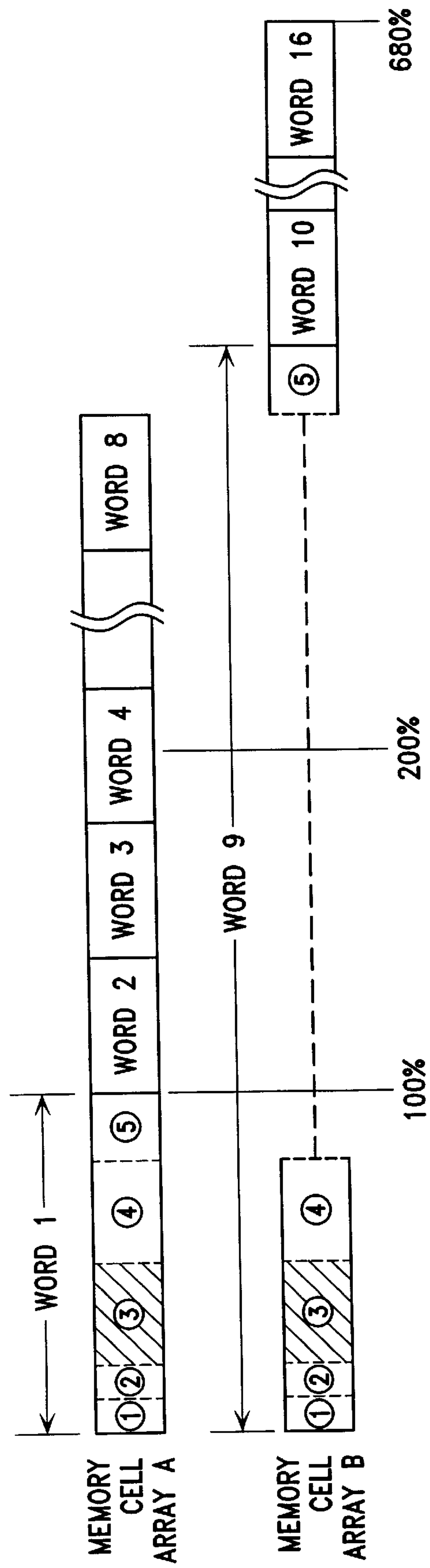
FIG. 14 is an explanatory view illustrating operating times in the conventional semiconductor memory in a serial access mode.
Figure 15:
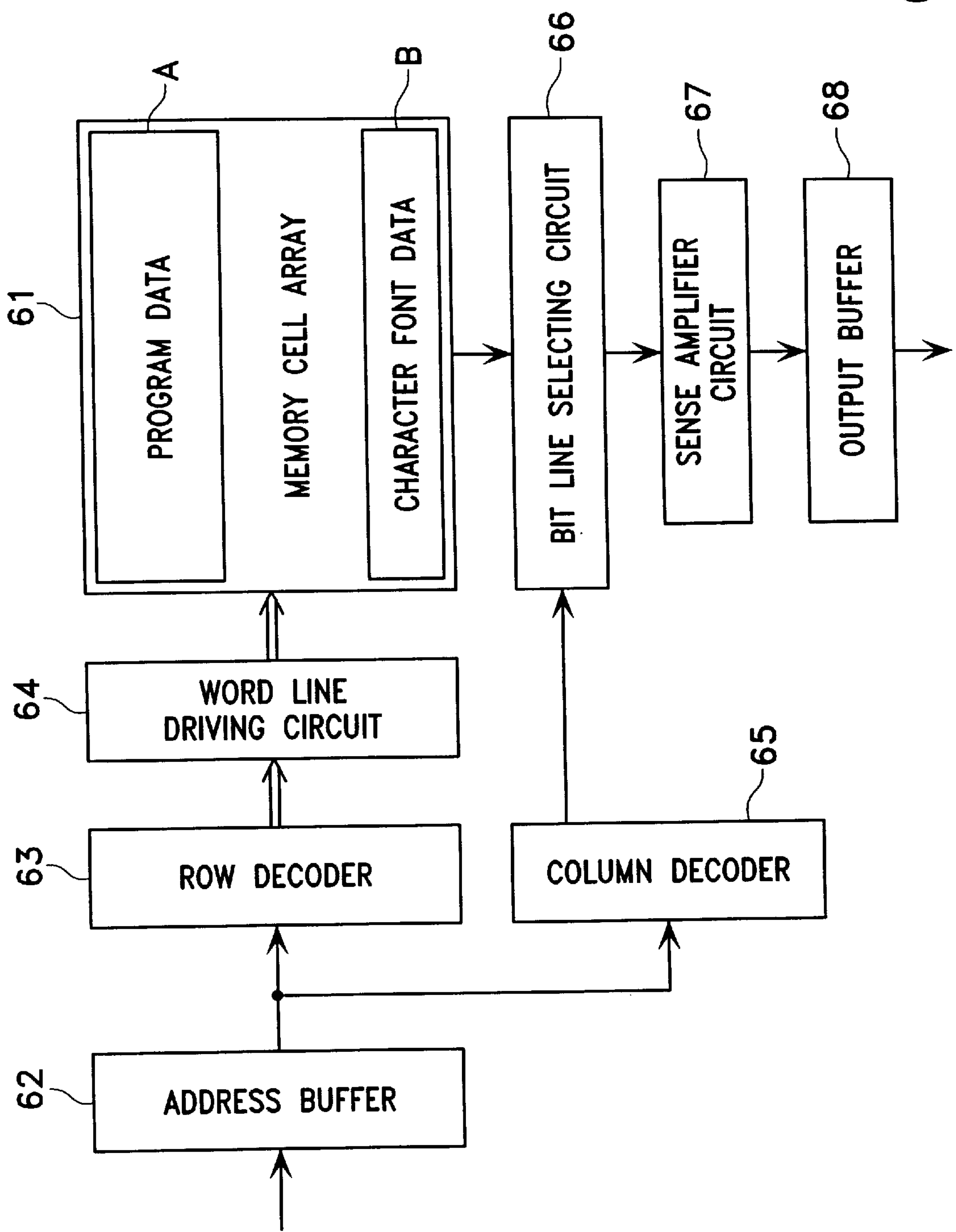
FIG. 15 is an explanatory view illustrating a schematic arrangement of primary parts of another conventional semiconductor memory.

As illustrated in FIG. 3, in respect to details of the operating times, compared with the conventional case wherein 30 percent of the total access time is spent for driving a word line (see FIG. 13), a time required for driving a word line in the first memory cell array 1 (③ in FIG. 3) in the arrangement of the present embodiment is ¼ of 30 percent, that is, 7.5 percent (note that hereinafter this is assumed to be 10 percent, so that the subsequent explanation is facilitated), and a time required for driving a word line in the second memory cell array 2 is $\frac{9}{4}$ of 30 percent, that is, 70 percent. Note that the operating times other than the time required for driving a word line are the same as in the conventional case. Therefore, in the total access time, the operation with respect to the first memory cell array 1 is made more speedy by 20 percent, whereas the operation with respect to the second memory cell array 2 is made slower by 40 percent.

In the first memory cell array 1, delays in the cases of the random access and the page access are conventionally 100 percent and 40 percent, respectively (hereinafter transcribed in a manner such as [100/40]), but in this case improvement is observed since they are [80/40]. It should be noted that in the first memory cell array 1, a time for driving a word line is required only in the access to the first word, which is the top address. There is no need to anew drive the word line in the access to the second through fourth words, and hence each required time with respect to the second through fourth words is only 40 percent. Note that the "top data" in claim 5 indicates the first word in this case.

Figure 4:
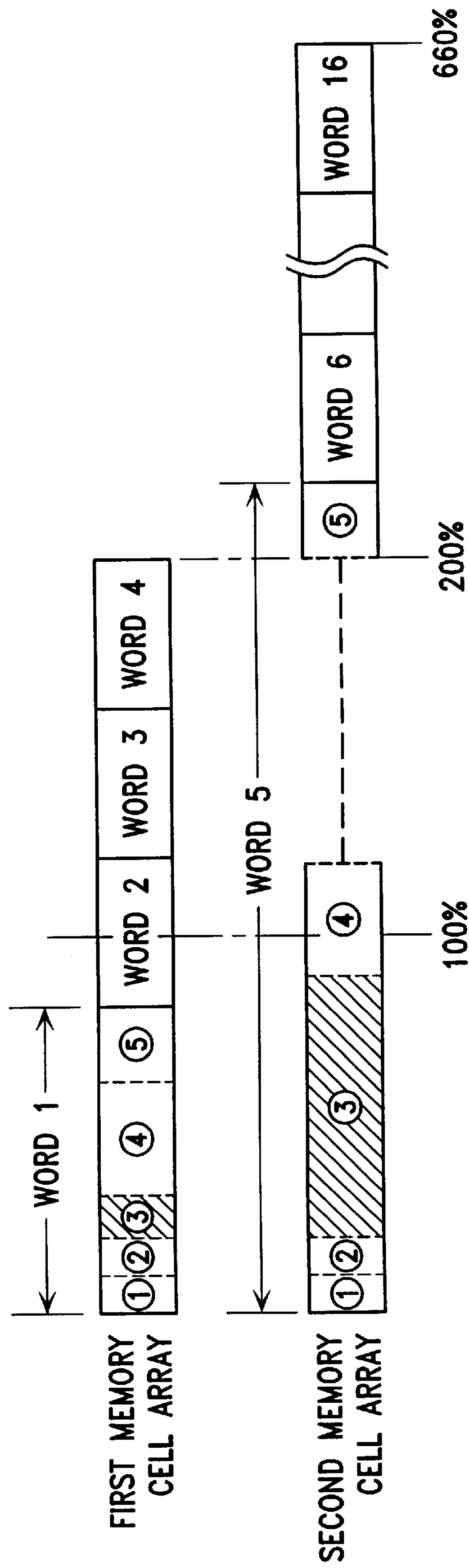
FIG. 4 is an explanatory view illustrating operating times in the semiconductor memory in a serial access mode.

In respect to the second memory cell array 2, a time required for driving a word line when reading a top address increases from 30 percent to 70 percent. However, as illustrated in FIG. 4, the operation for transition of the word line and the like in the second memory cell array 2 is completed while the read of data from the first memory cell array 1 is being carried out. Therefore, it is possible to start the read of the fifth and subsequent words immediately after the read of the fourth word in the first memory cell array 1 is finished. Therefore, an increase in a time required for driving the word line in the second memory cell array 2 does not affect at all.

In the present embodiment, the first through fourth words are stored in the first memory cell array 1 and the fifth through sixteenth words are stored in the second memory cell array 2, but an optimal number of words stored in the first memory cell array 1 varies with the number of words contained in one page and delays in peripheral circuits such as the sense amplifiers.

For example, in the case where only the top word (W0) among words in page data is stored in the first memory cell array 1 and the other words (W1 through W15) are stored in the second memory cell array 2, the ratio of lengths in the row direction (word line direction) becomes 1:15 (conventionally, 8:8). Therefore, as to the first memory cell array 1, the product of a wire resistivity and a wire capacity of a word line (R×C) becomes $\frac{1}{64}$ ($=\frac{1}{8}\times\frac{1}{8}$) of that in the conventional case, while as to the second memory cell array 2, it becomes 3.5 ($=\frac{15}{8}\times\frac{15}{8}$) times that in the conventional case.

Figure 5:
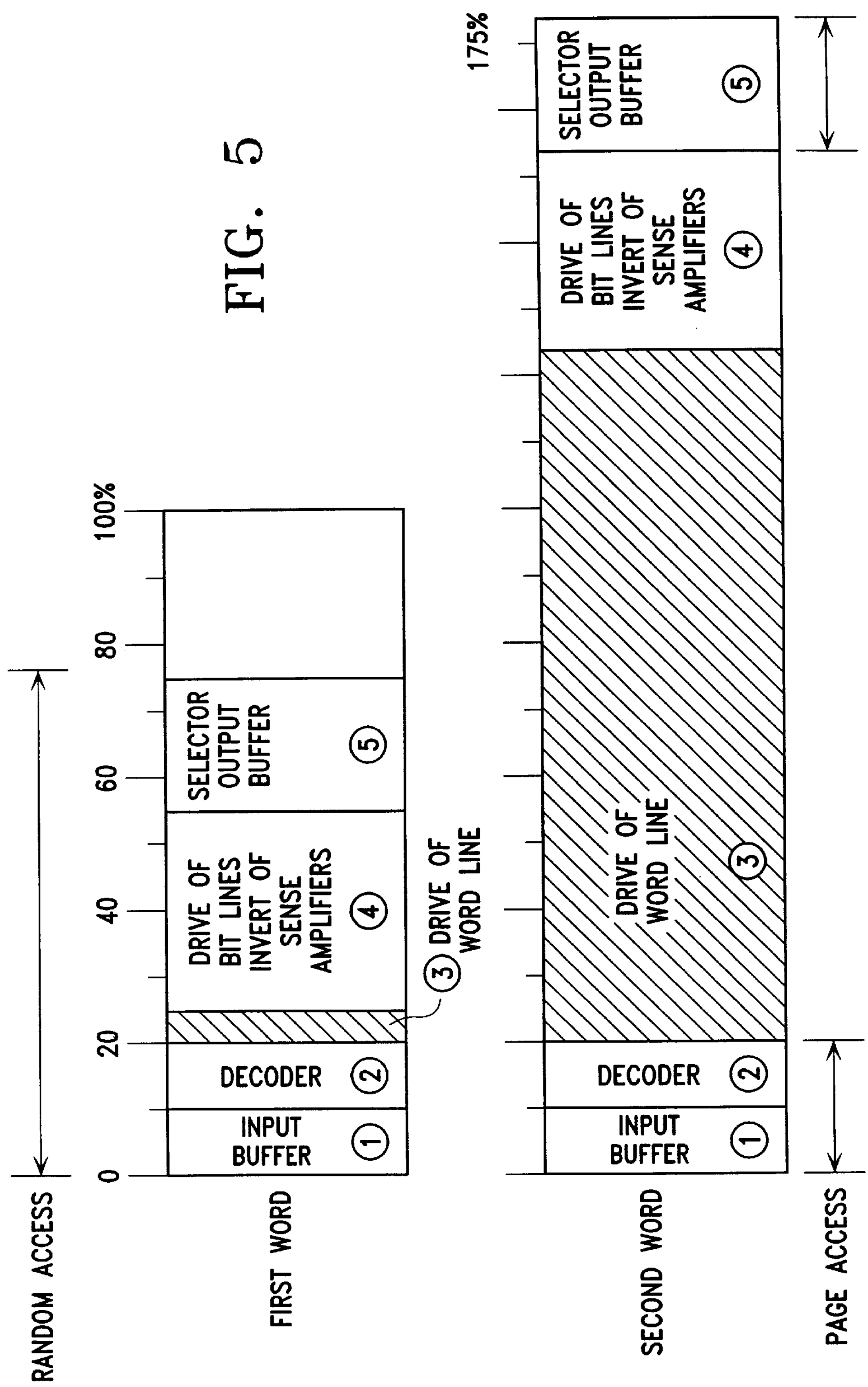
FIG. 5 is an explanatory view illustrating another example set, different from that of FIG. 3, of detailed times required for primary operations of the semiconductor memory of FIG. 2.

In respect to details of the operating times, compared with the conventional case wherein 30 percent of the total access time is spent for driving a word line, a time spent for driving a word line in the first memory cell array 1 in the above arrangement is about 0.5 percent (note that hereinafter this is assumed to be about 1 percent, so that the subsequent explanation is facilitated), and in the second memory cell array 2 it is about 3.5 times that in the conventional case, that is, about 105 percent, as illustrated in FIG. 5. Therefore, compared with the whole access time in the conventional case, the access is made more speedy by 29 percent in the first memory cell array 1, while it is made slower by 75 percent in the second memory cell array 2.

Figure 6:
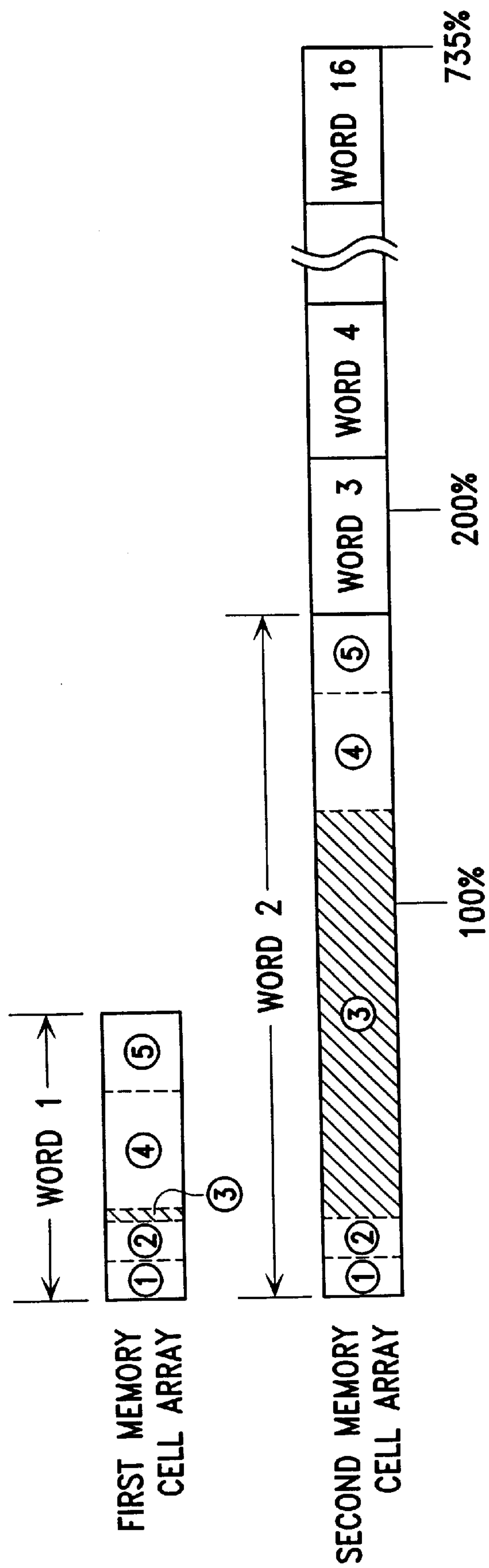
FIG. 6 is an explanatory view illustrating operating times in the semiconductor memory in the serial access mode.

Therefore, a delay in the random access and a delay in the page access, which are [100/40] in the conventional case, appear to be possibly improved to [71/40]. However, in this case, as illustrated in FIG. 6, 175 percent is required for access to the second word which is the top word in the second memory cell array 2, and the transition of the word line in the second memory cell array 2 has not yet finished at a time of 111 (=71+40) percent, that is, when the access to the first memory cell array 1 finishes. Therefore, the read of the second word has not yet been ready when the access to the first memory cell array 1 is completed, and as a result the delays in the random access and the page access in the first memory cell array become 135 (=175−40) percent and 40 percent, respectively. Thus, an effect of the present invention cannot be achieved.

Figure 7:
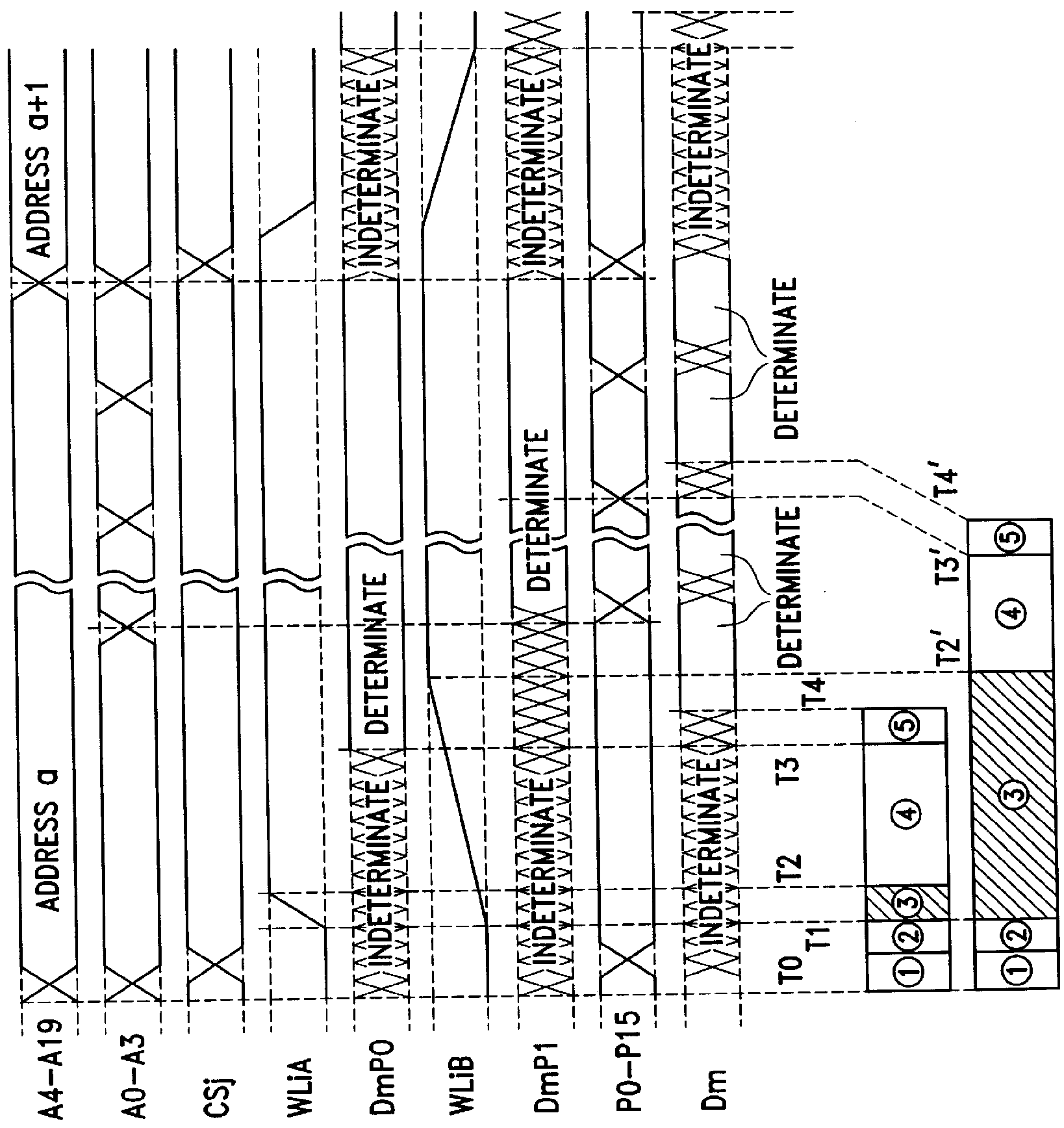
FIG. 7 is a timing chart illustrating operations of the semiconductor memory.

The following description will explain an operation of reading data from the present semiconductor memory in detail, while referring to a timing chart in FIG. 7. In the following description, a case where the first through fourth words (W0 through W3) are stored in the first memory cell array 1 and the rest fifth through sixteenth words (W4 through W15) are stored in the second memory cell array 2 is taken as an example.

As illustrated in FIG. 7, an address signal (A0 through A19) to be supplied to the input buffer 11 are determined at a time T0, and a page address (a) is read out.

Then, at a time T1, with determination of a row address (A8 through A19), an output of the decoders is determined, and one of the word lines is made active. In other words, the word line becomes "high"-level. Note that in the present embodiment one word line is composed of a pair of a word line WLiA in the first memory cell array 1 and a word line WLiB in the second memory cell array 2. The word line WLiA is made active at a time T2, while the word line WLiB is made active at a time T2'.

At the time T1, with determination of a column address (A4 through A7), one (CSj) of the column selecting lines CS0 through CS15 is made active ("high"-level) by the column decoder 6 and the bit line selecting circuits 7. Subsequently, a column selecting MOS transistor whose input terminal is connected to the column selecting line CSj thus made active becomes in an "ON" state, and memory cells Mmijn (m=0 through 7, n=0 through 15) connected to the MOS transistor are selected. Information in the selected memory cells is supplied to the sense amplifier circuit 10 through the column selecting MOS transistor, and sense amplifier outputs to be outputted therefrom are determined in the first memory cell array 1 at a time T3 and in the second memory cell array 2 at a time T3', respectively. With the above operation, the read of page data at an address designated by the column address and the row address (A4 through A19) is perfected.

Then, a page signal (P0 through P15) is determined in accordance with page address signals (A0 through A3), and an output (DmP0 through DmP3) of the first memory cell array 1 is determined in accordance with a portion (P0 through P3) of the determined page signal. The output (DmP0 through DmP3) thus determined is outputted at a time T4 through the selector circuit 9. Then, in response to page signals (P4 through P15), an output (DmP4 through DmP15) is outputted at a time T4' through the selector circuit 9.

As has been described above, the semiconductor memory of the present embodiment is arranged so that a time required for driving a word line is shortened in the first memory cell array 1 having shorter word lines. By doing so, in the serial access, the access to the top data is made faster by storing the first word, which is the top word, in the first memory cell array 1.

Note that the above description of the first embodiment explains a case where the access to the top word is made faster with the use of a semiconductor memory having not less than two memory cell arrays which differ in lengths of word lines, but the application of the present invention is not limited to this. Effective use of a semiconductor memory can be achieved in the random access mode as well, by causing not less than two memory cell arrays differing in lengths of word lines to store not less than two types of data differing in read-out speeds, respectively. This case will be explained in the descriptions of the second and third embodiments.

[Second Embodiment]

Figure 8:
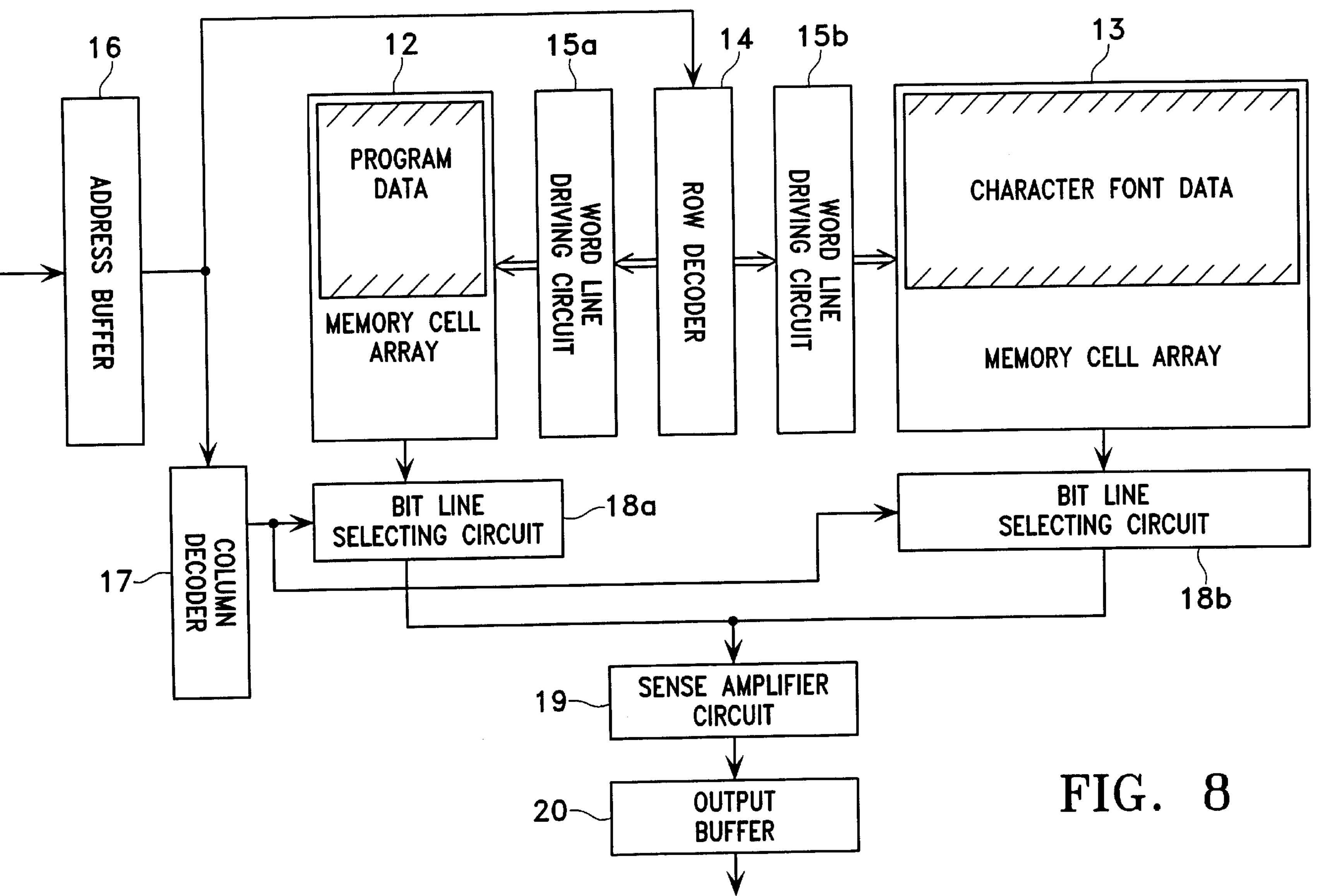
FIG. 8, showing another embodiment of the present invention, is a block diagram illustrating a schematic arrangement of primary parts of a semiconductor memory.

A semiconductor memory of the present embodiment is arranged as follows, as illustrated in FIG. 8. Word line driving circuits 15*a* and 15*b* are provided so as to have a row decoder 14 therebetween, and a first memory cell array 12 and a second memory cell array 13 are separately provided so as to have the word line driving circuits 15*a* and 15*b* and the row decoder 14 therebetween. The semiconductor memory further includes an address buffer 16, a column decoder 17, bit line selecting circuits 18*a* and 18*b*, a sense amplifier circuit 19, and an output buffer 20.

The address buffer 16 holds an address signal supplied from outside, and sends it to the row decoder 14 and the column decoder 17. The row decoder 14 decodes content of another predetermined portion of the address signal supplied from the address buffer 16, and outputs a word line selecting signal. Based on the output of the row decoder 14, the word line driving circuits 15*a* and 15*b* respectively drive corresponding selected word lines in the first memory cell array 12 and the second memory cell array 13, respectively.

The column decoder 17 decodes content of another portion of the address signal supplied from the address buffer 16, and outputs a bit line selecting signal. Based on the output of the column decoder 17, the bit line selecting circuits 18*a* and 18*b* connect the sense amplifier circuit 19 with a plurality of bit lines that are connected to a plurality of selected memory cells among those connected to the selected pair of word lines in the first and second memory cell arrays 12 and 13. The output buffer 20 receives an output of the sense amplifier circuit 19, and outputs read-out data to outside.

Note that word selecting means in claim 2 is composed of the row decoder 14 and the word line driving circuits 15*a* and 15*b*. The aforementioned first and second memory cell arrays 12 and 13 constitute divided regions of a memory cell array described in claim 1, respectively.

In the present embodiment, based on the output of the row decoder 14, the word line driving circuits 15*a* and 15*b* are simultaneously driven, and a corresponding pair of word lines in the first and second memory cell arrays 12 and 13 is simultaneously driven. Besides, based on the output of the column decoder 17, only either of the bit line selecting circuits 18*a* and 18*b* connects selected bit lines to the sense amplifier circuit 19.

In FIG. 8, the first memory cell array 12 and the second memory cell array 13 are memory cell array regions resulting on division of one memory cell array, as described above, and each of them is composed of a plurality of memory cells provided in a matrix form. A word line length of the first memory cell array 12 and that of the second memory cell array 13 differ from each other. The first memory cell array 12 is arranged so as to have shorter word lines, while the second memory cell array 13 is arranged so as to have longer word lines.

Here, as mentioned in the description of the first embodiment, the first memory cell array 12 having shorter word lines completes transition more quickly. Therefore, program data which should be read at a high speed are stored in the first memory cell array 12, while character font data which may be read at a relatively lower speed are stored in the second memory cell array 13. The word line lengths of the first and second memory cell arrays 12 and 13 are set, taking into consideration respective read-out speeds required for reading data therefrom.

By doing so, when an address signal indicating a region where the program data are stored is inputted, the high-speed reading is carried out, since the read operation is carried out with respect to the first memory cell array 12 that have shorter word lines, where the drive of a word line is conducted at a high speed. On the other hand, when an address signal indicating a region where the character font data are stored is inputted, the data are read at a relatively lower speed since the read operation is carried out with respect to the second memory cell array 13 that have longer word lines.

[Third Embodiment]

The following description will explain a third embodiment of the present invention in detail, while referring to figures.

Figure 9:
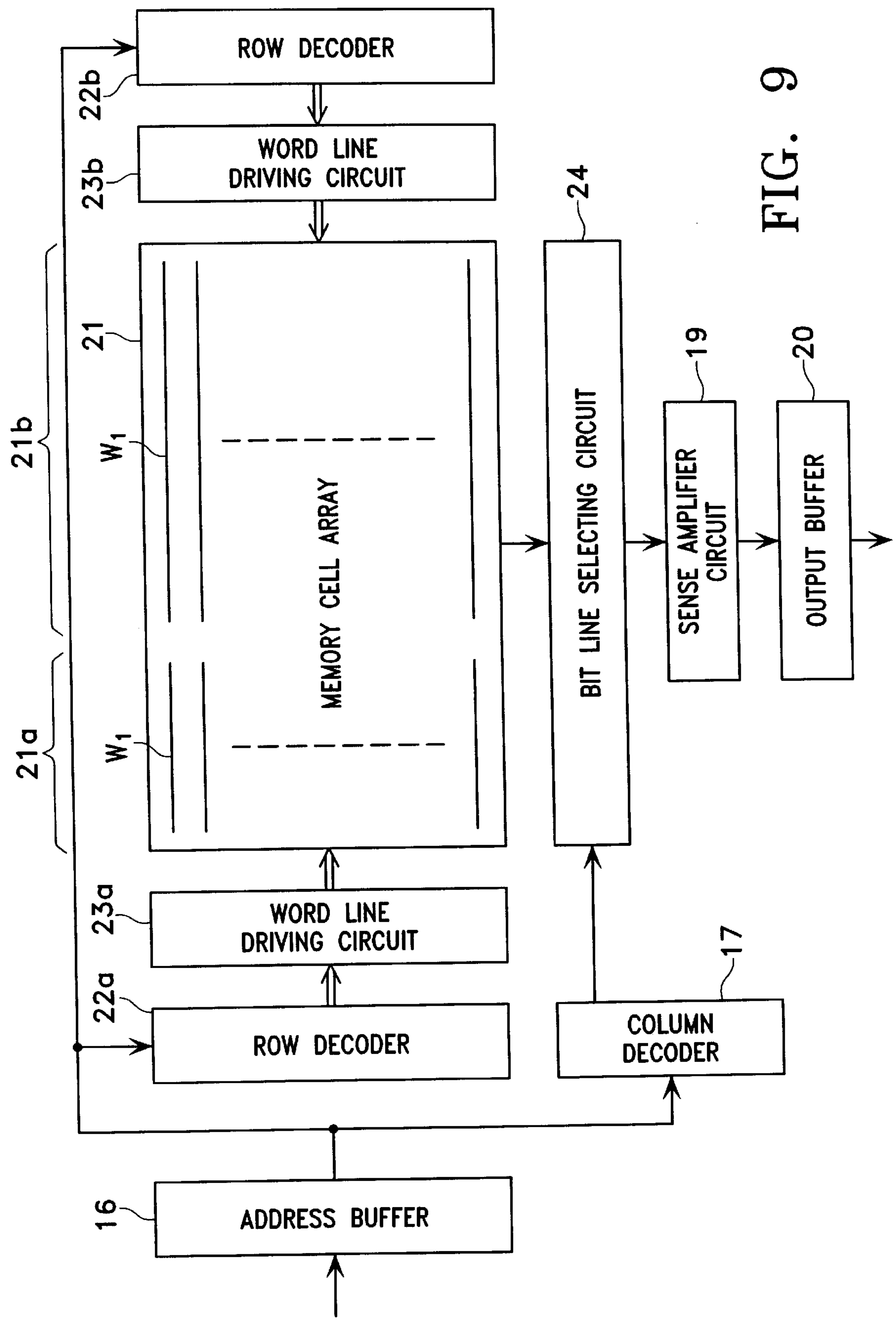
FIG. 9, showing still another embodiment of the present invention, is a block diagram illustrating a schematic arrangement of primary parts of a semiconductor memory.
Figure 10:
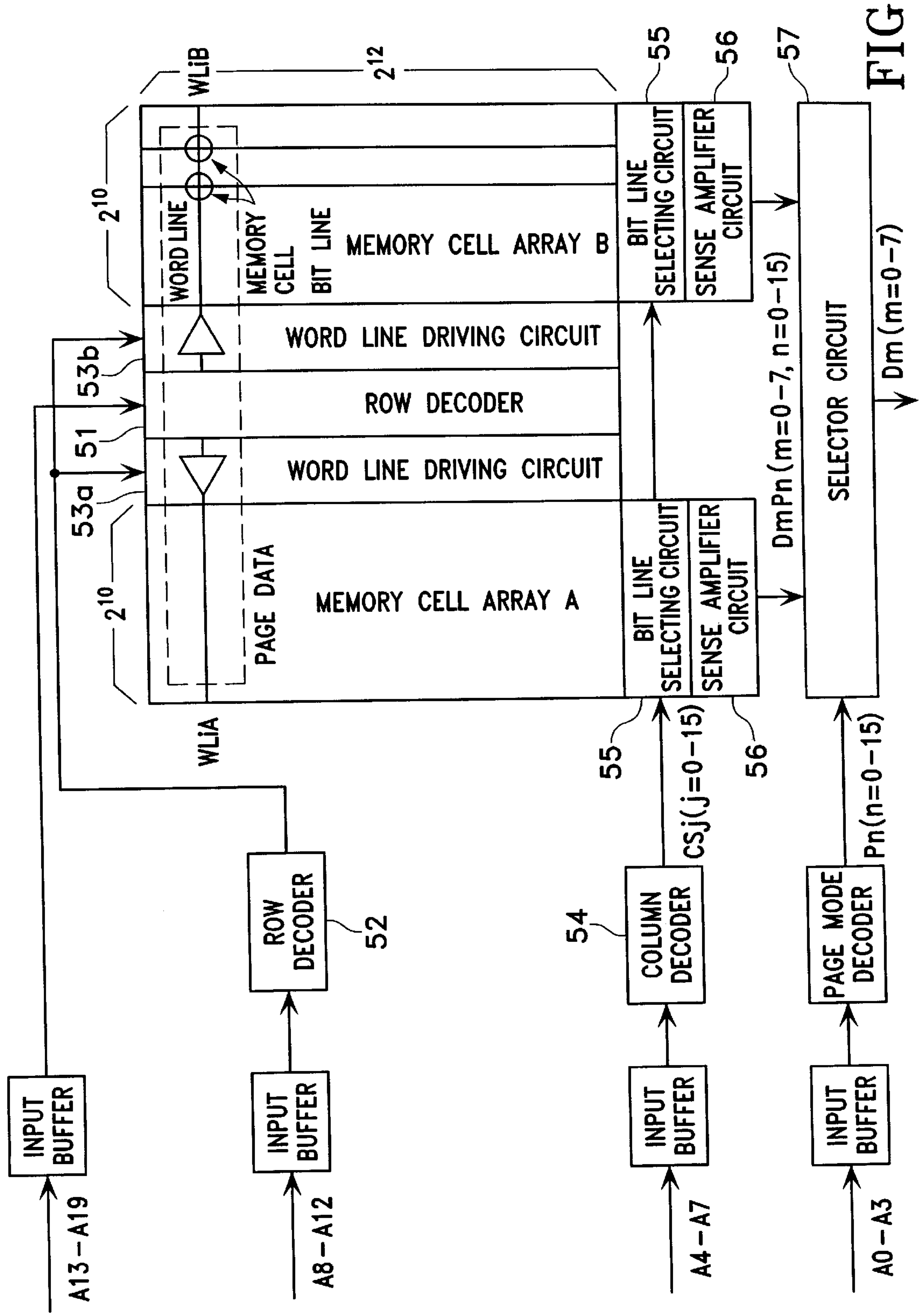
FIG. 10 is a block diagram illustrating a schematic arrangement of primary parts of a conventional semiconductor memory.
Figure 11:
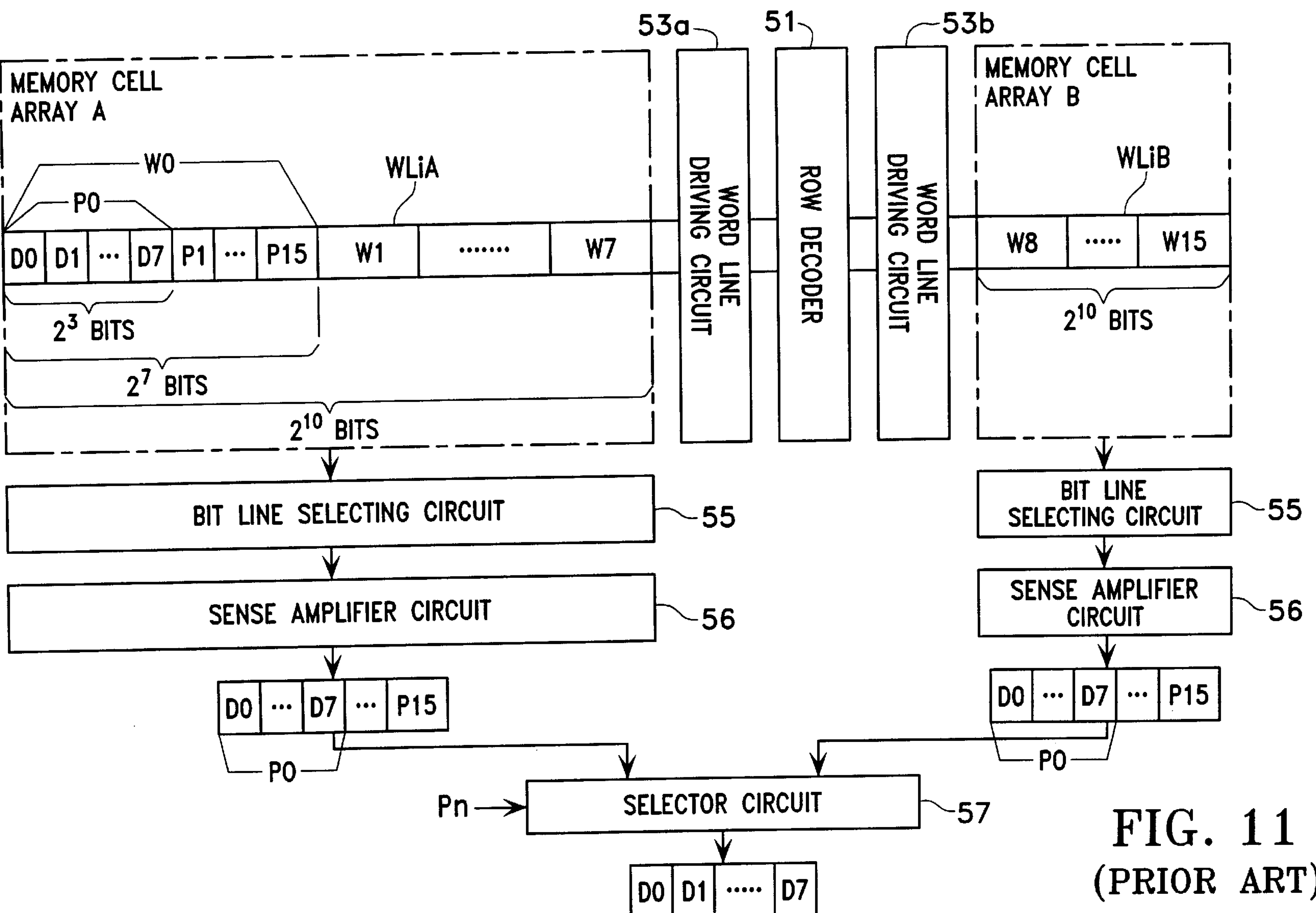
FIG. 11 is an explanatory view illustrating an example of an arrangement of data which are stored in the conventional semiconductor memory.
Figure 12:
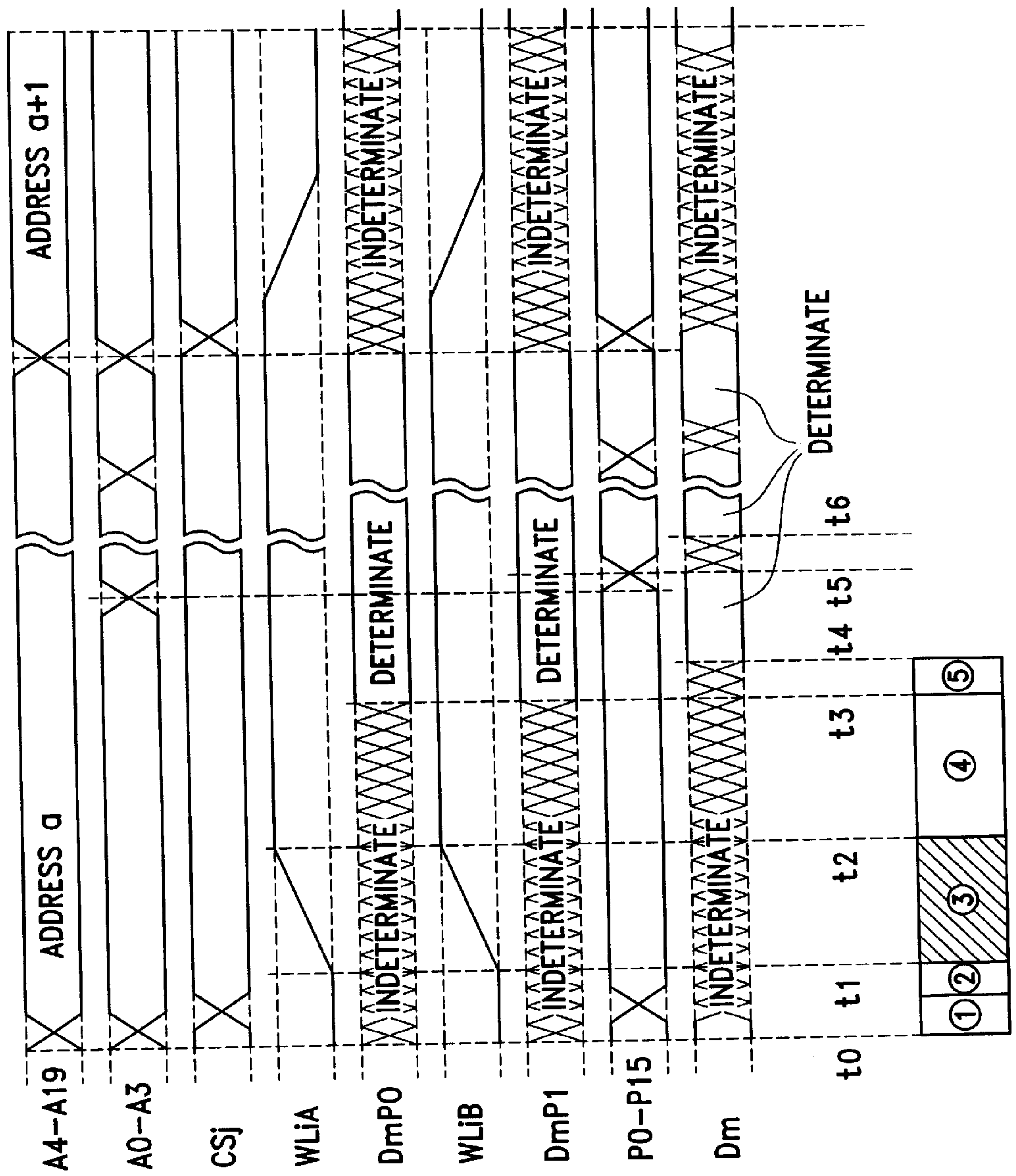
FIG. 12 is a timing chart illustrating operations of the conventional semiconductor memory.

A semiconductor memory in accordance with the present embodiment is arranged as follows, as illustrated in FIG. 9. A single memory cell array 21 in which word lines are cut at a predetermined position is provided, and a row decoder 22*a* and a word line driving circuit 23*a* are provided on one side of the memory cell array 21, while a row decoder 22*b* and a word line driving circuit 23*b* are provided on the other side of the memory cell array 21. The semiconductor memory further includes an address buffer 16, a column decoder 17, a bit line selecting circuit 24, a sense amplifier circuit 19, and an output buffer 20.

Furthermore, a bit line selecting circuit 24 having the same function as that of the bit line selecting circuits 18*a* and 18*b* in FIG. 8 is provided with respect to the memory cell array 21. Based on an output of the column decoder 17, the bit line selecting circuit 24 connects the sense amplifier circuit 19 with a plurality of bit lines which are connected to a plurality of selected memory cells among a plurality of memory cells connected with a selected word line in the memory cell array 21. The address buffer 16, the column decoder 17, the sense amplifier circuit 19, and the output buffer 20 are arranged in the same manner as that in the second embodiment, and therefore, their description is omitted here.

Note that the word line selecting means described in claim 3 is composed of the row decoders 22*a* and 22*b* and the word line driving circuits 23*a* and 23*b*.

In the present embodiment, the word line driving circuits 23*a* and 23*b* are simultaneously driven based on outputs of the row decoders 22*a* and 22*b*, and corresponding word lines in memory cell array regions 21*a* and 21*b* are simultaneously driven. Based on the output of the column decoder 17, the bit line selecting circuit 24 connects bit lines in either of the regions to the sense amplifier circuit 19.

In the aforementioned memory cell array 21, as described above, the word lines are cut at a predetermined position, and the memory cell array 21 can be accordingly divided into two regions. Among the two regions, a region in which the word line segments ($W_1$) are short is a first region 21*a*, while the other region in which the word line segments ($W_2$) are long is a second region 21*b*. In the first region 21*a*, program data which should be read at a high speed are stored, whereas in the second region 21*b*, character font data which may be read at a comparatively lower speed are stored. The lengths of the word line segments in the regions 21*a* and 21*b* are respectively set, taking into consideration respective read-out speeds required for reading data therefrom.

By doing so, when an address signal indicating a region where the program data are stored is inputted, the high-speed reading is carried out since the read operation is carried out with respect to the first region 21*a* having shorter word line segments, where the driving of a word line is conducted at a high speed. On the other hand, when an address signal indicating a region where the character font data are stored is inputted, the data are read at a relatively lower speed since the read operation is carried out with respect to the second region 21*b* having longer word line segments.

As has been described so far, the semiconductor memory of any one of the above embodiments has a memory cell array composed of a plurality of memory cells provided in a matrix form, the memory cell array being divided into at least two regions, wherein one of the memory cell array regions has word lines shorter than those in the other region. For this reason, as to the memory cell array region having the shorter word lines, a time required for driving the word lines can be reduced.

Therefore, by storing the top data in the region having the shorter word lines, the access with respect to the semiconductor memory can be made speedy in the serial access operation. Besides, in the case where first data requiring a high read-out speed is stored in a memory cell array having shorter word lines while second data requiring a comparatively lower read-out speed is stored in a memory cell array having longer word lines, each data can be read out at a speed suitable to the required read-out speed without wasteful power consumption in word line driving circuits, only by appropriately setting respective lengths of the word lines in the memory cell arrays.

Furthermore, by dividing the memory cell array into two regions and providing them so that word line selecting means for selecting word lines and driving the selected word lines is provided therebetween, the number of constituents of the word line selecting means such as row decoders is made minimum. By doing so, access to the top data in the serial access operation is made more speedy, with no increase in chip areas in the memory cell array.

Moreover, in the case where the semiconductor memory is arranged so that one word line driving circuit for driving the word lines is provided in each memory cell array region, a time required for driving the word lines can be further reduced.

Note that in the first and second embodiments one word line driving circuit is provided on each side of the row decoder, but, the word lines of both the memory cell arrays may be driven by one word line driving circuit. However, it should be noted that the time required for driving the word lines is further decreased by, as in the first and second embodiments, utilizing two word line driving circuits and causing them to discretely drive the word lines in the first memory cell array and the second memory cell array, respectively.

In the above embodiments, the memory cell array is divided into two regions, but the memory cell array may be divided into three or more regions. In the case where the memory cell array is divided into not less than three regions, the access to the top data is made speedy by arranging the word lines so that the word lines in a region where in the serial access operation the top data is stored are shorter than those in the other regions. However, in the case where the memory cell array is divided into two as in the above embodiments, the number of constituents of the word line selecting means such as row decoders can be minimized, and the access to the top data in the serial access operation is made speedy without an increase in chip areas in the memory cell array. In addition, in the case of a driving operation in the random access mode, by dividing the memory cell array into not less than three regions, the drive of the word lines in each region can be made further speedy.

In the second and third embodiments, character font data are stored as data requiring a low read-out speed, but the present invention can be also effectively applied to semiconductor memories storing voice data, dictionary data, kana-kanji conversion data, or the like, as data requiring a low read-out speed. Moreover, the present invention can be effectively applied to semiconductor memories storing a plurality of types of data together among data requiring a low read-out speed, for example, character font data and voice data together.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device, comprising a memory cell array composed of a plurality of memory cells provided in a matrix form, said memory cell array being divided into at least two regions, wherein:

each memory cell array region has a plurality of word lines, each word line extending substantially across the cell array region; and the plurality of word lines in one of the memory cell array regions having a shorter length than those in the other memory cell array region.

2. A semiconductor memory device as set forth in claim 1, further comprising:

word line selecting means for selecting word lines and driving the selected word lines, wherein:

said at least two memory cell array regions comprise two regions; and said word line selecting means is interposed between said two memory cell array regions.

3. A semiconductor memory device as set forth in claim 1, further comprising:

word line driving means for driving each of said plurality of word lines, wherein:

the word lines on said memory cell array are cut at a predetermined position so that said memory cell array is divided into two regions; and one word line selecting means is provided on each side of said memory cell array so that each word line selecting means selects predetermined word lines and drives the selected word lines in each memory cell array region.

4. A semiconductor memory device as set forth in claim 1, further comprising word line driving circuits for driving the word lines, one word line driving circuit being provided in each memory cell array region.

5. A semiconductor memory device, comprising a memory cell array composed of a plurality of memory cells provided in a matrix form, said memory cell array being divided into at least two regions, wherein:

each memory cell array region has different word lines from those in the other region so that each region is driven by the word lines thereof;

one of said memory cell array regions has word lines shorter than those in the other region; and said semiconductor memory device being driven in a serial access mode in which memory cells in a same row connected to a word line which is made active in response to an input address are simultaneously selected, and the memory cells selected are sequentially read in response to input of a page address, wherein:

the memory cell array region which has the shorter word lines stores at least top data which is the first to be read during a read operation in the serial access mode.

6. A semiconductor memory device, storing first data requiring a relatively high read-out speed and second data requiring a read-out speed lower than that for the first data, and comprising a memory cell array composed of a plurality of memory cells provided in a matrix form, said memory cell array being divided into at least two regions, wherein:

each memory cell array region has different word lines from those in the other region so that each region is driven by the word lines thereof;

one of said memory cell array regions has word lines shorter than those in the other region;

the first data is stored in the memory cell array region which has the shorter word lines; and the second data is stored in a memory cell array region which has the longer word lines.

7. The semiconductor memory device as set forth in claim 6, wherein:

the first data is program data; and the second data is either character font data, voice data, dictionary data, or kana-kanji conversion data.

8. A data access method for reading data stored in a semiconductor memory device, the semiconductor memory device having a memory cell array composed of a plurality of memory cells provided in a matrix form, the memory cell array being divided into at least two regions, each of the regions having a plurality of word lines extending substantially across the region;

one of the memory cell array regions, having shorter word lines than those in the other region, the memory cell array region which has the shorter word lines, storing top data which is the first to be read during serial access, said method comprising the step of:

conducting a data access operation in the serial access mode with respect to data so that the data are sequentially read from the top data.

* * * * *